United States Patent
Hasegawa et al.

(10) Patent No.: US 10,001,590 B2
(45) Date of Patent: Jun. 19, 2018

(54) OPTICAL TRANSMISSION MODULE

(71) Applicant: Oclaro Japan, Inc., Kanagawa (JP)

(72) Inventors: Takayuki Hasegawa, Kanagawa (JP); Daisuke Murakami, Kanagawa (JP); Takeshi Yamashita, Kanagawa (JP)

(73) Assignee: OCLARO JAPAN, INC., Kanagawa (JP)

( * ) Notice: Subject to any disclaimer, the term of this patent is extended or adjusted under 35 U.S.C. 154(b) by 0 days. days.

(21) Appl. No.: 15/067,617

(22) Filed: Mar. 11, 2016

(65) Prior Publication Data

US 2016/0277116 A1     Sep. 22, 2016

(30) Foreign Application Priority Data

Mar. 20, 2015   (JP) ................................. 2015-057797

(51) Int. Cl.
*H04B 10/00* (2013.01)
*G02B 6/36* (2006.01)
*G02B 6/00* (2006.01)
*H01S 5/022* (2006.01)
*H01S 5/0683* (2006.01)

(52) U.S. Cl.
CPC ............ *G02B 6/00* (2013.01); *H01S 5/02284* (2013.01); *H01L 2224/48091* (2013.01); *H01L 2224/8592* (2013.01); *H01S 5/0222* (2013.01); *H01S 5/02216* (2013.01); *H01S 5/02228* (2013.01); *H01S 5/0683* (2013.01)

(58) Field of Classification Search
CPC .......... H04B 10/50; H01L 2224/48091; H01L 2924/00014; H01L 2224/8592; H01S 5/02228; H01S 5/02284; H01S 5/0683; H01S 5/02216; H01S 5/0222; G02B 6/00
USPC ...... 398/25, 137, 182, 195, 212; 385/88, 89, 385/92, 93
See application file for complete search history.

(56) References Cited

U.S. PATENT DOCUMENTS

| | | | | |
|---|---|---|---|---|
| 5,959,752 A * | 9/1999 | Ota | ..................... | H04B 10/40 398/103 |
| 6,239,828 B1 * | 5/2001 | Ito | ........................ | B41J 2/451 347/241 |
| 6,264,377 B1 * | 7/2001 | Mitsuda | ............... | G02B 6/4246 257/E33.067 |
| 6,369,924 B1 * | 4/2002 | Scharf | .................. | G02B 6/4246 398/117 |
| 6,547,451 B1 * | 4/2003 | Nishikawa | ........... | G02B 6/4246 385/88 |
| 7,013,088 B1 * | 3/2006 | Jiang | .................... | G02B 6/4204 385/88 |

(Continued)

FOREIGN PATENT DOCUMENTS

JP    2005-019746 A    1/2005

*Primary Examiner* — Amritbir Sandhu
(74) *Attorney, Agent, or Firm* — Mattingly & Malur, PC

(57) ABSTRACT

An optical transmission module that converts an electric signal to an optical signal and outputs the optical signal, including: a package; a plurality of light-emitting elements each emitting light in the interior of the package; a plurality of light-receiving elements each including a light-receiving surface on which a portion of the light is incident in the interior of the package, for monitoring light outputs of the plurality of light-emitting elements; and light-shielding members provided on the plurality of light-receiving elements while avoiding the light-receiving surfaces.

4 Claims, 4 Drawing Sheets

(56) References Cited

U.S. PATENT DOCUMENTS

| | | | | |
|---|---|---|---|---|
| 8,121,484 | B2* | 2/2012 | Kihara | H01S 5/02212 398/135 |
| 8,987,655 | B2* | 3/2015 | Sasada | G02B 6/4206 250/214.1 |
| 9,106,338 | B2* | 8/2015 | Hui | H04B 10/2503 |
| 9,122,024 | B2* | 9/2015 | Lee | G02B 6/4201 |
| 9,806,821 | B2* | 10/2017 | Nakamura | H04B 10/54 |
| 2003/0152391 | A1* | 8/2003 | Kuhara | G02B 6/4246 398/164 |
| 2003/0210866 | A1* | 11/2003 | Kuhara | G02B 6/4246 385/49 |
| 2004/0022487 | A1* | 2/2004 | Nagasaka | G02B 6/4204 385/31 |
| 2005/0226636 | A1* | 10/2005 | Hiramatsu | H01S 5/02228 398/182 |
| 2006/0228079 | A1* | 10/2006 | Tamanuki | G02B 6/4201 385/92 |
| 2006/0269197 | A1* | 11/2006 | Uno | G02B 6/4246 385/93 |
| 2007/0019964 | A1* | 1/2007 | Whitehead | H04B 10/40 398/141 |
| 2007/0104426 | A1* | 5/2007 | Yun | G02B 6/4214 385/88 |
| 2007/0146881 | A1* | 6/2007 | Tanaka | G02B 6/4246 359/485.06 |
| 2007/0272882 | A1* | 11/2007 | Ishihara | G01S 7/497 250/559.29 |
| 2008/0044135 | A1* | 2/2008 | Furuichi | G02B 6/327 385/34 |
| 2008/0231771 | A1* | 9/2008 | Oishi | H01L 33/56 349/62 |
| 2010/0247043 | A1* | 9/2010 | Sugawara | G02B 6/4201 385/93 |
| 2011/0044696 | A1* | 2/2011 | Lim | G02B 6/4246 398/139 |
| 2011/0052125 | A1* | 3/2011 | Lee | G02B 6/4246 385/88 |
| 2013/0011104 | A1* | 1/2013 | Sato | G02B 6/4244 385/93 |
| 2013/0039662 | A1* | 2/2013 | Brooks | G02B 6/12007 398/91 |
| 2013/0135605 | A1* | 5/2013 | Wada | G01C 3/00 356/4.01 |
| 2014/0126917 | A1* | 5/2014 | Sato | H04B 10/40 398/182 |
| 2014/0199064 | A1* | 7/2014 | Yagisawa | H04B 10/60 398/25 |
| 2015/0036985 | A1* | 2/2015 | Shibuya | G02B 6/4214 385/93 |
| 2015/0300614 | A1* | 10/2015 | Tamura | G02B 6/4268 362/231 |
| 2015/0333831 | A1* | 11/2015 | Lai | H04B 10/50 398/200 |
| 2015/0362685 | A1* | 12/2015 | Shah | G02B 6/4214 385/89 |
| 2016/0154177 | A1* | 6/2016 | Han | G02B 6/4251 385/14 |
| 2016/0178735 | A1* | 6/2016 | Shirasaka | G01S 17/026 356/614 |
| 2016/0282174 | A1* | 9/2016 | Hasegawa | G01J 1/0214 |

* cited by examiner

OPTICAL TRANSMISSION MODULE

CROSS-REFERENCE TO RELATED APPLICATION

The present application claims priority from Japanese application JP2015-057797 filed on Mar. 20, 2015, the content of which is hereby incorporated by reference into this application.

BACKGROUND OF THE INVENTION

1. Field of the Invention

The present invention relates to an optical transmission module.

2. Description of the Related Art

JP2005-019746 A discloses a semiconductor laser device including a light-emitting element and a light-receiving element disposed in an accommodating portion, in which signal light from the light-emitting element is emitted through a transparent portion formed in a wall surface of the accommodating portion. The semiconductor laser device includes a scattered-light-shielding member for blocking scattered light, caused by the reflection of the signal light emitted through the transparent portion from the light-emitting element at the transparent portion, from being incident on the light-receiving element.

An optical transmission module that converts an electric signal to an optical signal and outputs the optical signal is provided with a light-receiving element for monitoring light emitted from a light-emitting element. The light-receiving element monitors a light output emitted from the light-emitting element, and the optical transmission module controls, based on the monitoring result, the intensity of the light emitted from the light-emitting element so as to be constant.

The light-receiving element is needed for each of light-emitting elements, so that an optical transmission module provided with a plurality of light-emitting elements is provided with as many light-receiving elements as the light-emitting elements.

Because of the demand for the miniaturization of the optical transmission module in recent years, when a plurality of light-emitting elements and a plurality of light-receiving elements are densely provided in one package, it is considered that leakage light or stray light from an adjacent light-emitting element, other than light emitted from one light-emitting element desired to be originally monitored, may also be incident on one light-receiving element.

When the leakage light or the like described above is incident on the light-receiving element, the light-receiving element cannot obtain a precise monitoring result. As a result, it may become difficult to control the intensity of the light emitted from the one light-emitting element so as to be constant.

SUMMARY OF THE INVENTION

It is an object of the invention to provide an optical transmission module provided with a plurality of light-emitting elements and a plurality of light-receiving elements, in which each of the plurality of light-receiving elements accurately monitors light emitted from the light-emitting element, and thus the intensities of the lights emitted from the plurality of light-emitting elements are controlled so as to be more constant.

Moreover, the above and other objects and novel features of the invention will be apparent from the description of the specification and the accompanying drawings.

An embodiment of the invention is directed to an optical transmission module that converts an electric signal to an optical signal and outputs the optical signal, including: a package; a plurality of light-emitting elements each emitting light in the interior of the package; a plurality of light-receiving elements each including a light-receiving surface on which a portion of the light is incident in the interior of the package, for monitoring light outputs of the plurality of light-emitting elements; and light-shielding members provided on the plurality of light-receiving elements while avoiding the light-receiving surfaces.

Moreover, at least a portion of the light-shielding member may be formed of a light-shielding resin.

Moreover, the optical transmission module may further include a beam splitter splitting the light emitted from each of the plurality of light-emitting elements, each of the plurality of light-receiving elements may be disposed on the beam splitter, and the light-receiving surface of each of the plurality of light-receiving elements may be provided on a side facing the beam splitter.

Moreover, each of the plurality of light-emitting elements may include a first light-emitting surface to output an optical signal used for optical transmission and a second light-emitting surface that is a surface opposite to the first light-emitting surface, the plurality of light-receiving elements may be disposed on the second light-emitting surface side, and output light from the second light-emitting surface may be incident on each of the plurality of light-receiving elements.

DETAILED DESCRIPTION OF THE INVENTION

First Embodiment

First, an outline of an optical transmission module according to a first embodiment of the invention will be described with reference to FIGS. 1 and 2.

Figure 1:
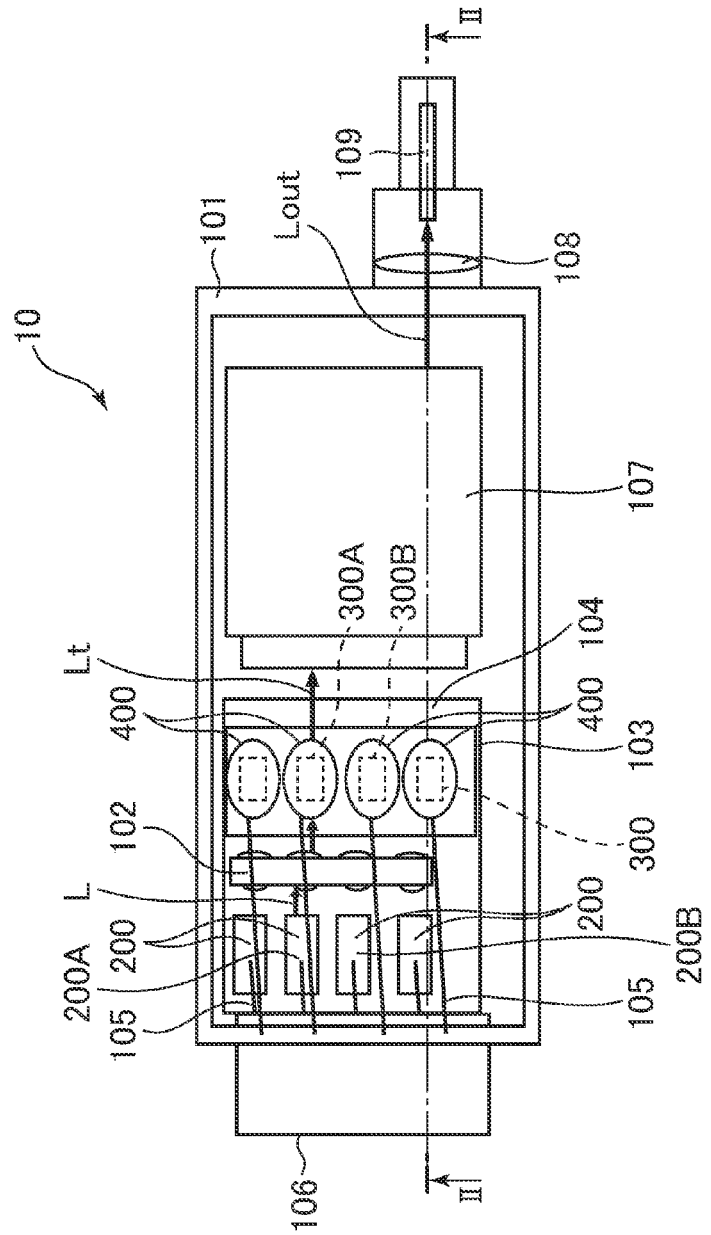
FIG. 1 is a diagram showing the state of the interior of an optical transmission module according to a first embodiment of the invention, viewed from above.

FIG. 1 is a diagram showing the state of the interior of the optical transmission module according to the first embodiment of the invention, viewed from above. Moreover, FIG. 2 is a diagram showing a cross-section along the section line II-II in FIG. 1, showing the configuration of the optical transmission module according to the first embodiment.

The optical transmission module 10 according to the first embodiment is an optical transmission module 10 that converts an electric signal to an optical signal and outputs the optical signal. The optical transmission module 10 includes: a package 101; a plurality of light-emitting elements 200 each emitting light by space transmission in the interior of the package 101; a repeater 107 for guiding a portion of the light in the interior of the package 101 and transmitting the portion of the light to the outside; a plurality of light-receiving elements 300 each including a light-receiving surface 301 on which another portion of the light is incident in the interior of the package 101, for monitoring light outputs of the plurality of light-emitting elements 200; and light-shielding members 400 provided on the plurality of light-receiving elements 300 while avoiding the light-receiving surfaces 301, for preventing the incidence of stray light on the plurality of light-receiving elements 300.

In the specification of the application, the light-receiving surface 301 of the light-receiving element 300 represents a surface on which light to be received is incident, and further, an area of the incident surface having a light-receiving function. The light-receiving element 300 is realized by a photodiode or the like, which roughly includes three types: a front surface incident type, a back surface incident type, and an end face incident type (waveguide type).

Photodiodes have a structure in which an absorbing layer that converts light into electricity is stacked on a semiconductor substrate, and is generally a substantially rectangular parallelepiped as a whole. A type in which the light to be received is incident from a surface on the side on which the absorbing layer is stacked is referred to as the front surface incident type; conversely, a type in which the light to be received is incident from a surface on the semiconductor substrate side is referred to as the back surface incident type; and a type in which the light to be received is incident from a surface in a direction vertical to the absorbing layer is referred to as the end face incident type.

That is, a surface not covered with the light-shielding member 400 is different depending on the type of the light-receiving element 300. In any case, however, it is a feature in the specification of the application that the light-shielding member 400 is provided while avoiding the surface on which the light to be received is incident.

Figure 2:
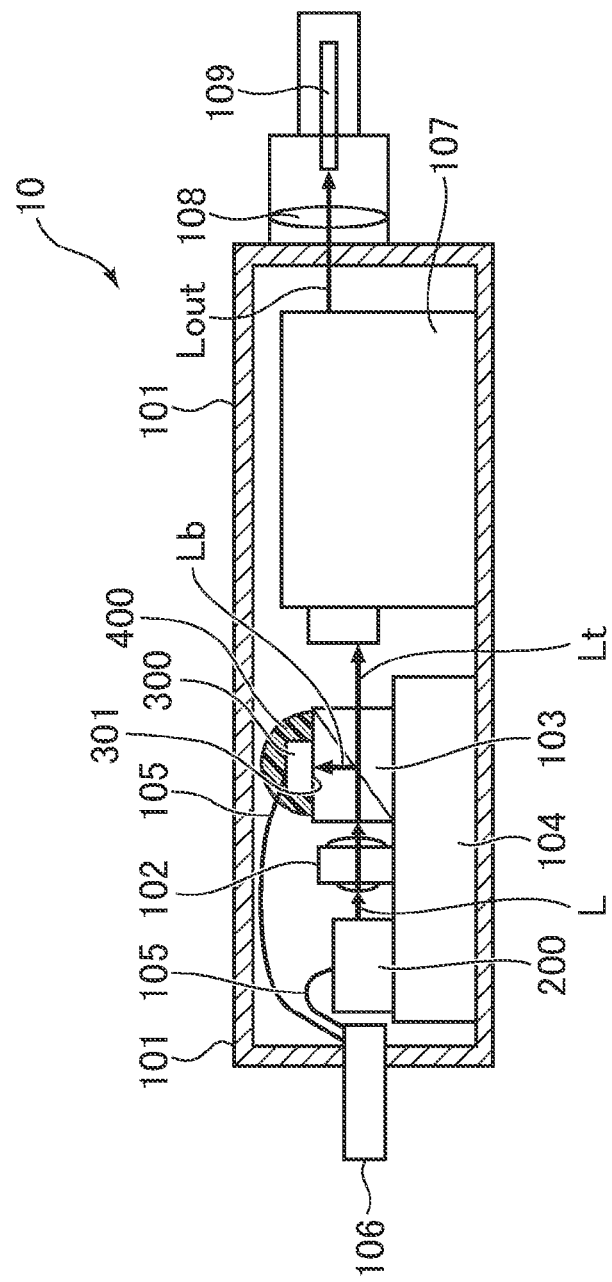
FIG. 2 is a diagram showing a cross-section along the section line II-II in FIG. 1, showing the configuration of the optical transmission module according to the first embodiment.

As shown in FIGS. 1 and 2, the light-emitting elements 200, a collimator lens 102, and a beam splitter (optical demultiplexer) 103 may be provided on a submount substrate 104 provided in the package 101 in the optical transmission module 10 according to the first embodiment.

The submount substrate 104 used for the optical transmission module 10 according to the first embodiment is formed of a ceramic material, and more specifically, may be formed of aluminum nitride, aluminum oxide, or the like. The submount substrate 104 can be substituted with a thin film submount, and a thin film submount may be used in the optical transmission module 10 according to the first embodiment.

In the optical transmission module 10 according to the first embodiment, the plurality of light-receiving elements 300 are provided on the beam splitter 103. The plurality of light-emitting elements 200 and the plurality of light-receiving elements 300 may be each connected with a feedthrough 106 via a wire 105 for establishing electrical connection to the outside as shown in, for example, FIGS. 1 and 2.

Moreover, the interior of the package 101 of the optical transmission module 10 according to the first embodiment may be in a vacuum state, or may be filled with an inert gas (for example, nitrogen gas or the like). Filling the interior of the package 101 with an inert gas as described above enhances the reliability of the optical transmission module 10.

As shown in FIG. 1, the plurality of light-emitting elements 200 are arranged in parallel and accommodated in the package 101. Each of the plurality of light-emitting elements 200 emits light L at a predetermined wavelength. The lights L emitted from the plurality of light-emitting elements 200 are emitted so as to be directed in the same direction.

The light-emitting element 200 provided in the package 101 may be realized by, for example, a semiconductor laser. Moreover, the plurality of light-emitting elements 200 may emit lights at different wavelengths.

As shown in FIGS. 1 and 2, in the optical transmission module 10 according to the first embodiment, each of the lights L emitted from the plurality of light-emitting elements 200 by space transmission in the interior of the package 101 passes through the collimator lens 102 provided in the direction in which the light L is emitted, and thus converted to parallel light.

The collimator lens 102 provided in the optical transmission module 10 according to the first embodiment may be a microlens array including a plurality of lenses arranged in parallel and coupled with each other as shown in FIGS. 1 and 2.

The light L converted to the parallel light is then incident on the beam splitter 103, and split into transmitted light Lt and split light Lb at a predetermined ratio. That is, the beam splitter 103 emits the transmitted light Lt in the optical axis direction (emitting direction of the light-emitting element 200), and emits the split light Lb in a direction vertical to the optical axis. In the optical transmission module 10 according to the first embodiment, the split light Lb is emitted by the beam splitter 103 in the upper direction in FIG. 2.

Then, a plurality of the split lights Lb directed upward by the beam splitter 103 are incident on the light-receiving surfaces 301 of the light-receiving elements 300. As shown in FIG. 2, each of the light-receiving elements 300 is disposed on the beam splitter 103, and the light-receiving surfaces 301 of the plurality of light-receiving elements 300 are provided on the side of the plurality of light-receiving elements 300 facing the beam splitter 103.

Moreover, the transmitted light Lt, which is a portion of the light emitted from the light-emitting element 200 and has passed through the beam splitter 103, is incident on the repeater 107 to combine light. The transmitted light Lt is combined with light at the repeater 107, and output as light Lout to be transmitted to the outside. Thereafter, the light Lout output from the repeater 107 is condensed by a condensing lens 108, and incident on a receptacle terminal 109 that is connected with a receptor.

By the way, the light intensity of the light L emitted from the light-emitting element 200 realized by a semiconductor laser or the like changes due to the influence of ambient temperature or the like even if a current supplied to the light-emitting element 200 is constant.

In order to make the light Lout output from the receptacle terminal 109 have a constant intensity, the intensity of the light L emitted from the light-emitting element 200 needs to be constant irrespective of external temperature changes or the like.

The light-receiving elements 300 are provided for monitoring the light outputs of the light-emitting elements 200. The light outputs of the light-emitting elements 200 are controlled based on the monitoring result so as to be constant.

Here, the light L emitted from the light-emitting element 200 has a predetermined radiation angle. Therefore, not all of the components of radiated light are directed in the optical axis direction, but there is a component of light not incident on the collimator lens 102. Further, there is also a component of light caused due to the fact that, for example, the transmitted light Lt after passing through the beam splitter, or the like, is not incident on the repeater 107 but is reflected by the repeater 107.

Here, the light-receiving element 300 made of semiconductor, which is realized by a photodiode or the like, is subjected to the influence of light other than the light incident on the light-receiving surface 301. The component itself of light not incident on the collimator lens 102, or the reflection of the component of the light or the above-described component of the light reflected by the repeater 107 in the package 101 becomes stray light, which may enter the light-receiving element 300 from a surface other than the light-receiving surface 301.

The optical transmission module 10 according to the first embodiment includes the plurality of light-emitting elements 200. If so, stray light originating from each of the plurality of light-emitting elements 200 is caused. For example, when stray light from a light-emitting element 200B adjacent to a light-emitting element 200A of the plurality of light-emitting elements 200 enters a light-receiving element 300A for monitoring light from the light-emitting element 200A, the light-receiving element 300A cannot precisely monitor the intensity of the light from the light-emitting element 200A. As a result, the control of the light-emitting element 200, which is performed based on the monitoring result, becomes difficult.

In order to suppress the influence of stray light on the light-receiving element 300, the optical transmission module 10 according to the first embodiment is provided with the light-shielding members 400 provided on the plurality of light-receiving elements 300 while avoiding the light-receiving surfaces 301. The light-shielding member 400 is provided on each of the light-receiving elements 300 while avoiding at least the light-receiving surface 301, so that the influence of stray light is suppressed.

The light-shielding member 400 used for the optical transmission module 10 according to the first embodiment is, for example, a member formed using a material that blocks (reflects and/or absorbs) light emitted from the light-emitting element 200.

The light-shielding member 400 may be provided on each of the plurality of light-receiving elements 300 so as to cover the entire light-receiving element 300 except for the light-receiving surface 301, for preventing the incidence of stray light on the plurality of light-receiving elements 300. By providing the light-shielding member 400 in this manner, the influence of stray light is further suppressed. Conversely, since the greatest amount of stray light is incident from the collimator lens side, a certain effect is obtained by covering only a surface on the collimator lens side with the light-shielding member 400.

For example, the light-shielding member 400 may be formed using a material in which metal that reflects the light emitted from the light-emitting element, a compound that absorbs the light emitted from the light-emitting element, or the like, is dispersed in a resin matrix. Alternatively, a member in which metal that reflects the light emitted from the light-emitting element, a compound that absorbs the light emitted from the light-emitting element, or the like, is provided only on the surface thereof may be used as the light-shielding member 400.

Moreover, at least a portion of the light-shielding member 400 may be formed of a light-shielding resin. Moreover, the light-shielding member 400 may be formed of a light-shielding resin.

As shown in FIGS. 1 and 2, when each of the plurality of light-receiving elements 300 is connected with the feedthrough 106 via the wire 105 for establishing electrical connection between the light-receiving elements 300 and the outside, the wire 105 connected with the light-receiving element 300 is provided to penetrate the light-shielding member 400.

When the wire 105 connected with the light-receiving element 300 is provided to penetrate the light-shielding member 400, the light-shielding member 400 may be formed by, for example, providing the wire 105 connected with the feedthrough 106 on the light-receiving element 300, applying (potting: resin potting) a light-shielding resin paste constituting the light-shielding member 400 so as to cover the light-receiving element 300, and then curing the resin paste.

The resin paste is soft, superior in form changing, and thus can be applied after the connection of the wire 105, so that the degree of freedom of the wire 105 is not hindered. Further, the resin paste is also superior in that the resin paste can be disposed in a space-saving manner.

In the above case, the light-shielding member 400 is provided in contact with the wire 105, and therefore, the light-shielding member 400 is more preferably configured of a material having a low electrical conductivity.

The optical transmission module 10 according to the first embodiment described above is configured such that, in the optical transmission module 10 provided with the plurality of light-emitting elements 200 and the plurality of light-receiving elements 300, each of the plurality of light-receiving elements 300 accurately monitors light emitted from the light-emitting element 200, and thus that the intensities of the lights emitted from the plurality of light-emitting elements 200 are controlled so as to be more constant.

Second Embodiment

Hereinafter, an outline of an optical transmission module 20 according to a second embodiment of the invention will be described with reference to FIGS. 3 and 4. Configurations having the same functions as those of the optical transmission module 10 according to the first embodiment in FIGS. 1 and 2 are denoted by the same reference numerals and signs in FIGS. 3 and 4.

Figure 3:
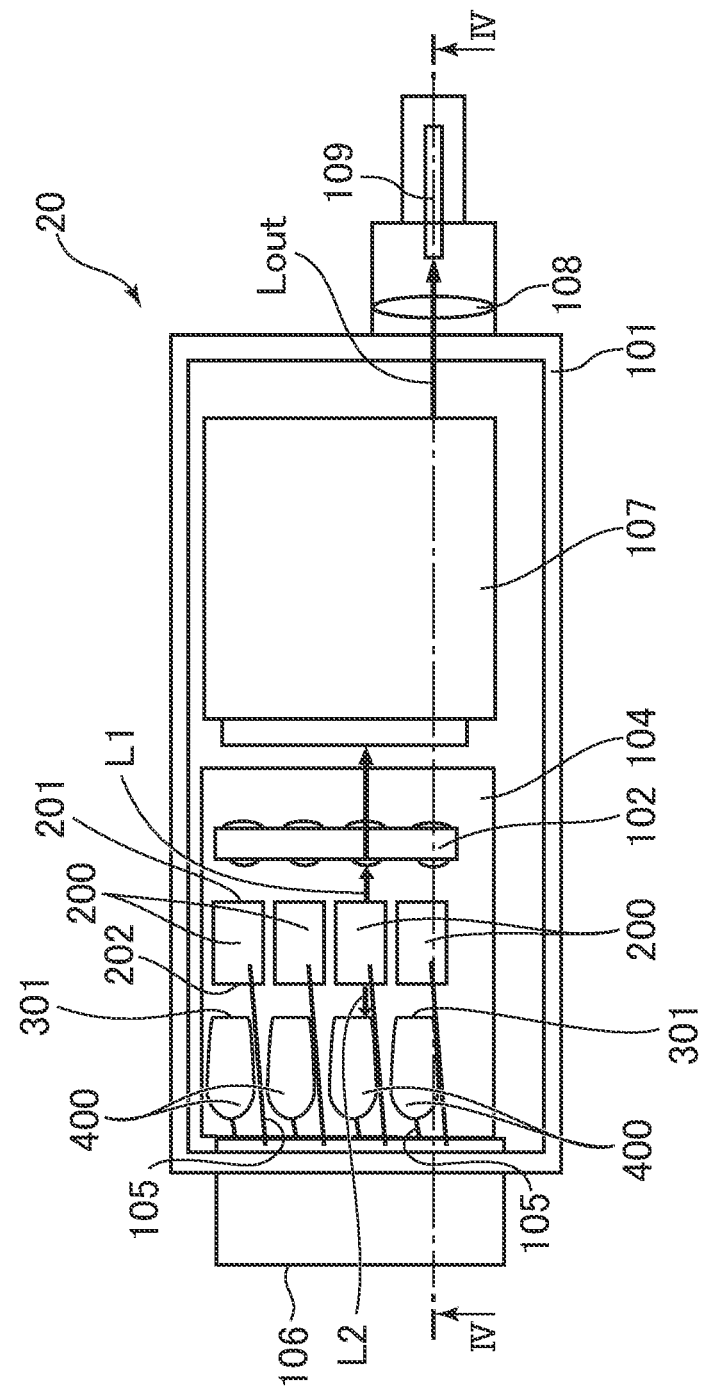
FIG. 3 is a diagram showing the state of the interior of an optical transmission module according to a second embodiment of the invention, viewed from above.
Figure 4:
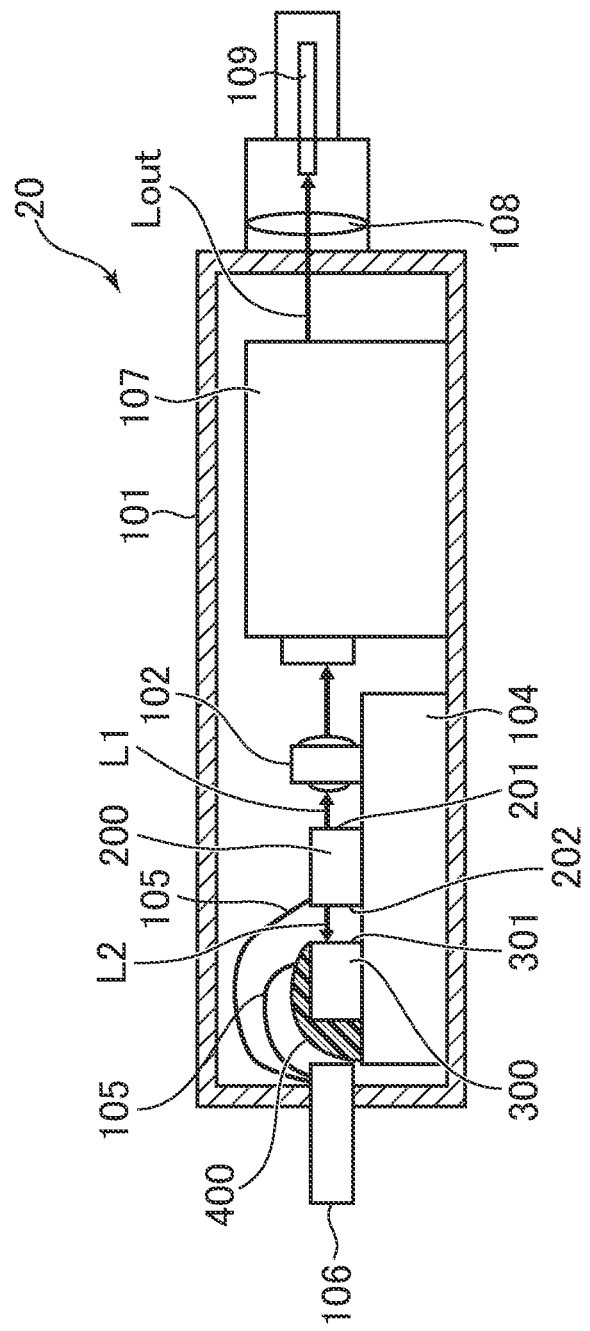
FIG. 4 is a diagram showing a cross-section along the section line IV-IV in FIG. 3, showing the configuration of the optical transmission module according to the second embodiment.

FIG. 3 is a diagram showing the state of the interior of the optical transmission module according to the second embodiment of the invention, viewed from above. FIG. 4 is a diagram showing a cross-section along the section line IV-IV in FIG. 3, showing the configuration of the optical transmission module according to the second embodiment.

The optical transmission module 20 according to the second embodiment is different from the optical transmission module 10 according to the first embodiment described above in that the beam splitter 103 is not included. In association with the difference, the installation positions of the plurality of light-receiving elements 300 are different, in the optical transmission module 20 according to the second embodiment, from the installation positions of the plurality of light-receiving elements 300 in the optical transmission module 10 according to the first embodiment.

Moreover, the light-emitting element 200 provided in the optical transmission module 10 according to the first embodiment performs monitoring with the light-receiving element 300 using a portion of the light L serving as signal light for optical transmission. In contrast, the light-emitting element 200 provided in the optical transmission module 20 according to the second embodiment is different in that the light-emitting element 200 includes a surface (one direction toward the collimator lens 102 in FIGS. 3 and 4) from which light L1 serving as signal light for optical transmission is emitted, and that monitoring is performed with the light-receiving element using emitted light L2 from the opposite surface.

In the light emitted from the light-emitting element 200 provided in the optical transmission module 20 according to the second embodiment, the light L1 emitted in one direction toward the collimator lens 102 passes through the collimator lens 102, and thereafter is incident on the repeater 107.

That is, each of the plurality of light-emitting elements 200 provided in the optical transmission module according to the second embodiment includes a first light-emitting surface 201 that emits the light L1 to be incident on the repeater 107 and a second light-emitting surface 202 that emits the light L2 to be incident on the light-receiving element 300.

The plurality of light-receiving elements 300 provided in the optical transmission module 20 according to the second embodiment are each provided on the extended line of the optical axis of the light L2 emitted from the second light-emitting surface 202 of the light-emitting element 200. The light-receiving surface 301 of the light-receiving element 300 is provided at a position facing the second light-emitting surface 202 of the light-emitting element 200.

Also in the optical transmission module 20 according to the second embodiment, the light-shielding member 400 is provided on each of the plurality of light-receiving elements 300 while avoiding the light-receiving surface 301, for preventing the incidence of stray light on the plurality of light-receiving elements 300, similarly to the optical transmission module 10 according to the first embodiment.

Moreover, in the embodiment, the light-shielding member 400 covers the light-receiving element 300 except for the light-receiving surface 301 and a connection surface between the light-receiving element 300 and the submount substrate 104. The submount substrate 104 does not transmit the light L2, and functions as a kind of light-shielding member. In this manner, the light-shielding member may not be configured of one member but may be configured of a plurality of members.

The other configurations of the optical transmission module 20 according to the second embodiment are similar to those of the optical transmission module 10 according to the first embodiment.

The optical transmission module 20 according to the second embodiment described above is configured such that, in the optical transmission module 20 provided with the plurality of light-emitting elements 200 and the plurality of light-receiving elements 300, each of the plurality of light-receiving elements 300 accurately monitors the light emitted from the light-emitting element 200, and thus that the intensities of the lights emitted from the plurality of light-emitting elements 200 are controlled so as to be more constant.

Although an example of using the repeater 107 has been shown in each of the first and second embodiments, the idea of the invention of the application can be applied also to an optical transmission module not using the repeater 107. Moreover, an example of avoiding the entire light-receiving surface 301 side of the light-receiving element 300 has been shown for the light-shielding member 400. However, the light-receiving surface 301 represents the area actually having the light-receiving function as described above, and the light-shielding member 400 may be provided also on a portion of the surface having the light-receiving area as long as the original light-receiving function is not hindered.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical transmission module that converts an electric signal to an optical signal and outputs the optical signal, comprising:
    a package;
    a substrate inside the package, the substrate having a plurality of surfaces including a first surface;
    a plurality of semiconductor lasers each emitting light inside the package, the plurality of semiconductor lasers disposed directly on the first surface of the plurality of surfaces of the substrate;
    a plurality of photodiodes each including a light-receiving surface receiving a portion of the emitted light inside the package, for monitoring a light output from a corresponding one of the plurality of semiconductor lasers, the plurality of photodiodes disposed over the first surface of the plurality of surfaces of the substrate; and
    a plurality of light shields made of only resin and disposed on each surface of each of the plurality of photodiodes except for the light-receiving surface of each photodiode;
    a plurality of wires respectively connected to the plurality of photodiodes for electrical connection, the plurality of wires penetrating the plurality of light shields; and
    a feedthrough for external electrical connection,
    wherein the plurality of wires are connected to the feedthrough.

2. The optical transmission module according to claim 1, further comprising:
    a beam splitter splitting the light emitted from each of the plurality of semiconductor lasers,
    wherein the plurality of photodiodes are disposed on the beam splitter, and
    wherein the light-receiving surface of each of the plurality of photodiodes are provided on a side facing the beam splitter.

3. The optical transmission module according to claim 1, wherein
    each of the plurality of semiconductor lasers includes a first light-emitting surface to output the optical signal used for optical transmission and a second light-emitting surface, which is opposite to the first light-emitting surface, to output the portion of the emitted light,
    each of the plurality of photodiodes are disposed facing the second light-emitting surface to receive the portion of the emitted light from the second light-emitting surface.

4. An optical transmission module that converts an electric signal to an optical signal and outputs the optical signal, comprising:
    a package;
    a substrate inside the package, the substrate having a plurality of surfaces including a first surface;
    a plurality of semiconductor lasers each emitting light inside the package, the plurality of semiconductor lasers disposed directly on the first surface of the plurality of surfaces of the substrate;

a plurality of photodiodes each including a light-receiving surface receiving a portion of the emitted light inside the package, for monitoring a light output from a corresponding one of the plurality of semiconductor lasers, the plurality of photodiodes disposed over the first surface of the plurality of surfaces of the substrate;

a plurality of wires connected to the plurality of photodiodes for electrical connection;

a plurality of light shields made of only resin and disposed on each surface of each of the plurality of photodiodes except for the light-receiving surface of each photodiode, each of the plurality of light shields provided to cover a portion of a corresponding one of the plurality of wires; and a feedthrough for external electrical connection, wherein the plurality of wires are connected to the feedthrough.

* * * * *